United States Patent
Poechmueller

(10) Patent No.: US 6,940,773 B2
(45) Date of Patent: Sep. 6, 2005

(54) METHOD AND SYSTEM FOR MANUFACTURING DRAMS WITH REDUCED SELF-REFRESH CURRENT REQUIREMENTS

(75) Inventor: Peter Poechmueller, Unterhaching (DE)

(73) Assignee: Infineon Technologies AG (DE)

( * ) Notice: Subject to any disclaimer, the term of this patent is extended or adjusted under 35 U.S.C. 154(b) by 71 days.

(21) Appl. No.: 10/404,561

(22) Filed: Apr. 2, 2003

(65) Prior Publication Data

US 2004/0196718 A1 Oct. 7, 2004

(51) Int. Cl.⁷ ................................................ G11C 7/00
(52) U.S. Cl. .............. 365/222; 365/189.01; 365/230.06
(58) Field of Search ................. 365/222, 189.01, 365/230.06

(56) References Cited

U.S. PATENT DOCUMENTS

| | | | |
|---|---|---|---|
| 4,207,618 A | 6/1980 | White, Jr. et al. | |
| 4,905,198 A | 2/1990 | Oishi et al. | |
| 5,365,487 A | 11/1994 | Patel et al. | |
| 5,410,510 A | 4/1995 | Smith et al. | |
| 5,477,491 A | * 12/1995 | Shirai | 365/194 |
| 5,859,801 A | 1/1999 | Poechmueller | |
| 5,890,198 A | 3/1999 | Pawlowski | |
| 5,905,687 A | 5/1999 | Brede et al. | |
| 5,991,214 A | 11/1999 | Merritt et al. | |
| 5,999,457 A | * 12/1999 | Sato | 365/189.01 |
| 5,999,473 A | 12/1999 | Harrington et al. | |
| 6,005,824 A | * 12/1999 | Crafts | 365/233 |
| 6,067,261 A | 5/2000 | Vogelsang et al. | |
| 6,327,208 B1 | 12/2001 | Kitade | |
| 6,366,517 B1 | 4/2002 | Tsujino et al. | |
| 6,404,690 B2 | 6/2002 | Johnson et al. | |
| 6,438,057 B1 | 8/2002 | Ruckerbauer | |
| 6,469,924 B2 | 10/2002 | Jain | |

* cited by examiner

*Primary Examiner*—Anh Phung
*Assistant Examiner*—Pho M. Luu
(74) *Attorney, Agent, or Firm*—Edell, Shapiro & Finnan, LLC

(57) ABSTRACT

A method and system for reducing self-refresh current requirements in a includes a DRAM chip that is sectioned into a number of segments. The entire DRAM chip is tested upon manufacture to determine the relative decay rates for each cell in the DRAM. For each segment, the refresh rate for that segment is selected based on the fastest decay rate for a DRAM cell in the segment. The DRAM is configured for refreshing memory cells during a self-refresh at different refresh rates for different segments. The refresh period is controlled for individual segments using techniques, such as programmable logic or fuses, to skip certain self-refresh cycles for those segments capable of operating at lower refresh rates. The refresh period in memory segments with strong memory cells can be reduced, thereby conserving current required to be drawn.

18 Claims, 8 Drawing Sheets

METHOD AND SYSTEM FOR MANUFACTURING DRAMS WITH REDUCED SELF-REFRESH CURRENT REQUIREMENTS

BACKGROUND OF THE INVENTION

1. Field of the Invention

The present invention relates to self-refresh circuits in semiconductor memory devices, and more particularly, to a system and method for reducing self-refresh current requirements.

2. Background Information

In the portable consumer electronics industry, recent advancements in microprocessor speeds and memory storage capabilities have resulted in a new generation of portable devices with significantly improved functionality. Along with additional features, portable electronic devices are continually being designed to operate more efficiently to draw less electrical current, and hence require less battery power. Such electronic devices (such as laptops, digital cameras, digital cellular telephones, personal digital assistants) are now capable of operating for longer periods of time before requiring battery replacement or recharge, which can be useful to consumers and are less expensive to operate.

Many portable electronic devices include dynamic random access memory ("DRAM") for temporary, or "volatile" (i.e., constant power required) data storage. A conventional DRAM is comprised of a plurality of memory cells within arrays of word lines and bit lines, arranged in a grid. As seen in FIG. 1, a single memory cell consists generally of a single transistor 10 and a single capacitor 11. The cell is accessed by activating a combination of a particular word line and bit line.

To write a data bit into a cell, an appropriate voltage is applied to the word line, which turns on the transistor 10, along with each other transistor on the word line. A high voltage (typically near 1.5V or 2V) or low voltage (typically near 0V) is then presented at the bit line to charge the capacitor 11 to a logic high or logic low value. When the voltage is removed from the word line, the charge on the capacitor remains to store a bit of information. Typically, an entire word is written into or read from a DRAM array by applying the voltage to the word line and an imposing or sensing voltage on each of the bit lines.

The charge levels that are stored in the capacitors of the DRAM array are affected by leakage currents, which causes the stored voltage values to dissipate over time. To maintain the accuracy of the data being stored in the capacitors, each cell of the DRAM periodically must be refreshed. This typically is accomplished by reading the data through a sense amplifier. This read operation automatically refreshes the cell signal because the memory cell is connected to the bitline during the voltage sensing and amplification process such that full signal levels are restored. Refresh operations were typically administered by commands from an external memory controller/processor, which intercedes during "stand-by" or "waiting" periods between read/write operations. More recently, DRAMs have been configured within self-refresh circuitry internal to the DRAM for carrying out refresh operations upon receiving a refresh command from the controller/processor (and selecting automatically the right cells to be refreshed).

The frequency by which memory periodically must be refreshed depends upon several factors, but it is typically refreshed at least every few hundred milliseconds (this is done in "small portions," for example, 7.8 $\mu$s each to restore the whole DRAM in 64 ms, i.e., 8 k refresh events are required . . . 8 k×7.8 ms=64 ms). Refresh rates for particular DRAM arrays are typically established by the manufacturer, based upon a worst-case high temperature condition. Generally, the overall relationship between temperature and refresh rates for DRAM arrays exhibit a positive slope, such that power consumption rises along with DRAM temperature. Since memory cells tend to vary slightly during manufacturing, the refresh rate is determined according to the fastest decaying bit of information in the DRAM. In other words, the refresh rate is determined according to the lowest-common denominator of performance, such that refresh operations successfully maintain the stored memory information in each memory cell. This can be performed by testing all of the cells of a manufactured DRAM to determine the decay time for each cell.

Refresh operations in a self-refresh circuit may be performed by utilizing an internal counter to sequentially address the cells, such that each cell is refreshed within a certain period of time. FIG. 2 is a known configuration of a DRAM with self-refresh capabilities. In this configuration, signal generator 20 provides a refresh clock signal to a refresh control circuit 22. As shown in FIG. 2, the refresh circuit is connected only to the row decoder. The rows in row decoder 24 are addressed such that each of the rows is addressed within the maximum refresh time of the memory device after a certain number of refreshments.

Since refresh operations require continuous charging and discharging of bitlines, it is power-consuming and the refresh process detracts from DRAM operating performance. Accordingly, several techniques have been developed to reduce the power required to refresh DRAMs. For example, one such technique is to slow down the refresh rate when the DRAM is operating at lower temperatures, when the decay time is longer such that a high refresh rate is not necessary. This can be done by slowing down the timer itself, or by designing refresh logic associated with the timer to only refresh only a fraction of the time when the DRAM is operating at a low temperature. Another technique is to design DRAMs such that the DRAM can be configured to operate at a selected refresh rate, depending upon the anticipated use. This can be accomplished by incorporating a fuse within the refresh circuitry, and then blowing the fuse to change the DRAM's refresh rate.

To further improve memory performance and reduce power consumption associated with DRAMs, semiconductor designers continually seek to improve refresh operations and decrease refresh rates. In view of the foregoing, it can be appreciated that a substantial need exists for a method and system for reducing self refresh current requirements in a DRAM without negatively affecting other performance characteristics of the semiconductor memory.

SUMMARY OF THE INVENTION

The present invention relates to a method and system for reducing self-refresh current requirements in a DRAMs. A DRAM chip is sectioned into a number of segments. The entire DRAM chip is tested upon manufacture to determine the relative decay rates for each cell in the DRAM. For each respective segment, the refresh rate for that segment is selected in accordance with the fastest decay rate for a DRAM cell in that segment. The DRAM is configured for refreshing memory cells during a self-refresh at different refresh rates for different segments. The refresh period is controlled for individual segments using techniques, such as programmable logic or fuses, to skip certain self-refresh cycles for those segments capable of operating at lower refresh rates. In this manner, the refresh period in memory segments with strong memory cells can be reduced, thereby conserving current required to be drawn.

A method is disclosed for reducing refresh frequency for a plurality of memory cells in a DRAM. The memory array containing a plurality of memory cells is portioned into a plurality of segments. Memory cells in the memory array are identified that require a refresh rate that is faster than the refresh rate required for the remaining memory cells in the memory array. A segment is identified that corresponds to the identified memory cells. When a refresh operation is enabled, memory cells in an identified segment are refreshed at a different refresh rate than the refresh rate that is applied to memory cells in other segments of the memory array.

A method is also disclosed for self-refreshing different segments of a DRAM at different refresh rates, wherein each segment is comprised of a plurality of word lines of memory cells. The method includes the steps of incrementing a multi-bit counter, wherein a plurality of bits correspond a word line address in the DRAM, determining the rate at which the segment that is associated with the word line address indicated by the counter is to be refreshed, wherein (i) segments having a high refresh rate are refreshed at each cycle of the counter, and (ii) segments with a low refresh rate are refreshed at intermittent cycles of the counter, and performing a refresh of memory cells in the word line depending upon the counter cycle and the refresh rate corresponding with the associated segment.

A refresh controller assembly for generating self-refreshes in a DRAM portioned into a number of segments is disclosed. The refresh controller includes a multi-bit counter having a plurality of bits corresponding to word line addresses in each segment of the DRAM, for incrementally generating word line addresses. The controller also includes logic for determining whether the word line at the address indicated by the counter is to be refreshed during a cycle of the counter, wherein different segments of the DRAM are refreshed at different refresh rates.

DETAILED DESCRIPTION OF THE INVENTION

Figure 1:
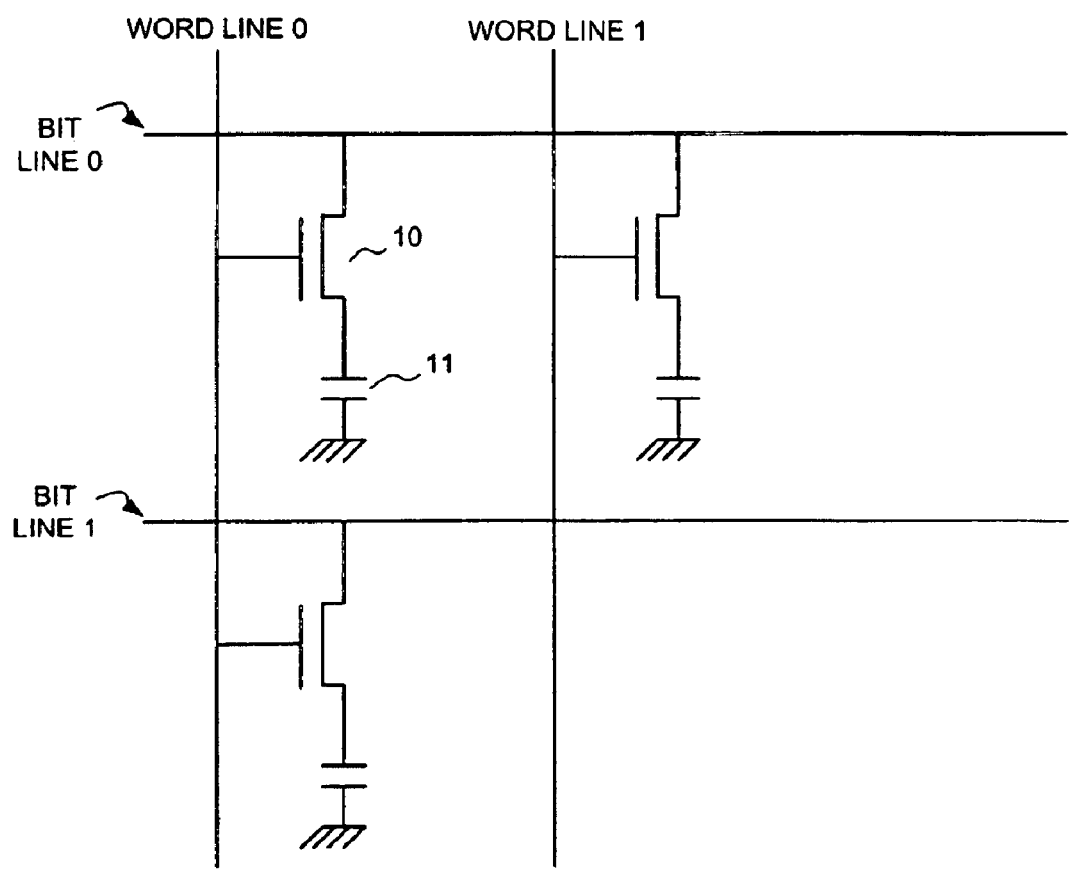
FIG. 1 is an electrical circuit schematic diagram of a portion of a conventional DRAM array.

Preferred embodiments of the present invention are described in detail with reference to the attached drawings. This invention may be embodied in many different forms and should not be construed as being limited to the embodiments set forth herein.

Embodiments of the present invention relate to methods and systems for reducing current requirements associated with DRAM self-refresh operations by dynamically assigning different refresh rates to different segments of a DRAM, based upon the decay times experienced in memory cells of the respective segments. Upon manufacture, the DRAM is evaluated to determine the operability and decay time for each of the memory cells in the DRAM. Systems and techniques are known for performing tests upon power-up for evaluating DRAMs after fabrication.

For those DRAM cells that are found to be defective and inoperable, a portion of the DRAM memory cell array is designated as a redundant memory section. When a defective memory cell is to be accessed for a read or write operation, on-chip logic circuitry is used to associate the address of the defective cell with a location in redundant memory. Banks of fuses can be included in the DRAM chip for storing the addresses of the defective memory cells, where the addresses are written into the fuse groups by laser destruction of selective fuse links. Each fuse can either remain closed or be blown open to represent a "0" or "1" logic state, such that groups of fuses can form logic words corresponding to row and column addresses of defective cells in the main memory.

In conventional DRAMs and DRAM manufacturing techniques, the refresh rate for the entire DRAM chip is determined according to the fastest decay time associated with a single memory cell. In other words, if it is known that all of the memory cells in a DRAM (excluding the defective cells) will lose their charges at some point after at least 64 milliseconds, then the refresh controller in the DRAM can be designed to refresh each cell once every 64 milliseconds. If some memory cells retain their charge for significantly longer than 64 milliseconds, however, these memory cells will be refreshed more often than required to retain the data.

It is known that complex leakage mechanisms result in a wide distribution of individual memory cell retention. After chip test and repair, memory cells show a distribution from 64 ms up to several seconds. Theoretically, power consumption could be minimized in a DRAM by refreshing each memory cell according to its own particular decay rate. Although such a system would eliminate unnecessary refreshes, the required logic likely would overwhelm the size and complexity of the chip, far outweighing any benefit. However, since DRAMs tend to have a grouping of cells in one or more areas on a DRAM chip that are characterized by requiring a slower than average refresh rate, a significant benefit could be realized by setting the refresh for cells in those areas differently from the rest of the chip.

In accordance with an embodiment of the present invention, a DRAM chip is divided into a plurality of segments. A refresh counter advances to self-refresh each word line in the memory as in a conventional refresh circuit in a memory. However, for each segment, logic is provided for determining whether to refresh word lines in that segment on each consecutive pass of the refresh counter, on alternating passes, on every third pass, etc. In this manner, the same refresh circuitry can be used across the entire chip, but different segments of the chip will experience different refresh rates. The logic that is used to determine the refresh rate each respective segment can be comprised of programmable logic or fuse-selectable logic.

Fuse-Selectable Logic Embodiment

In addition to including a bank of fuses for directing read and write operations to and from defective cells, it is also possible to place fuses on a DRAM for dynamically setting the refresh rate. Similar to the fuse bank that is used for storing addresses of the defective cells, fuses also can be laser-blown to provide fuse-selectable logic for adjusting operation of the DRAM after fabrication, without requiring significant hardware changes.

Figure 2:
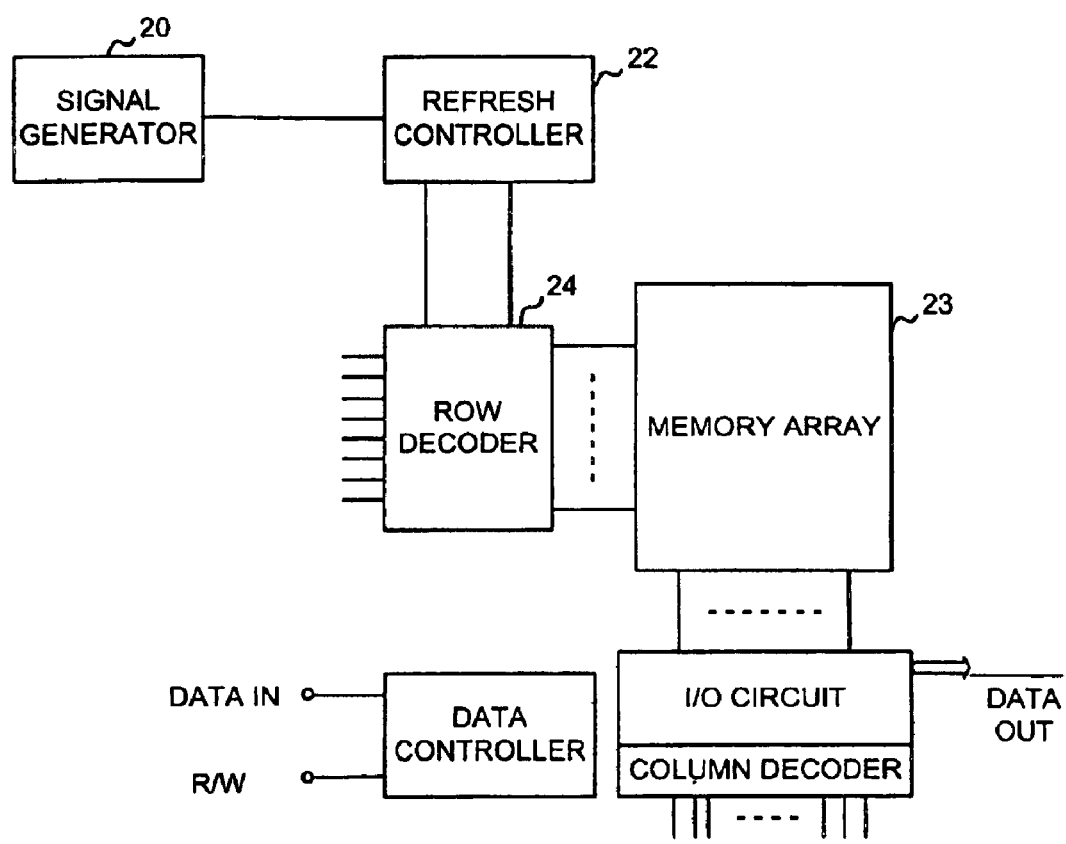
FIG. 2 is a schematic diagram of an architecture for a conventional DRAM array configured for performing self-refresh operations.
Figure 3:
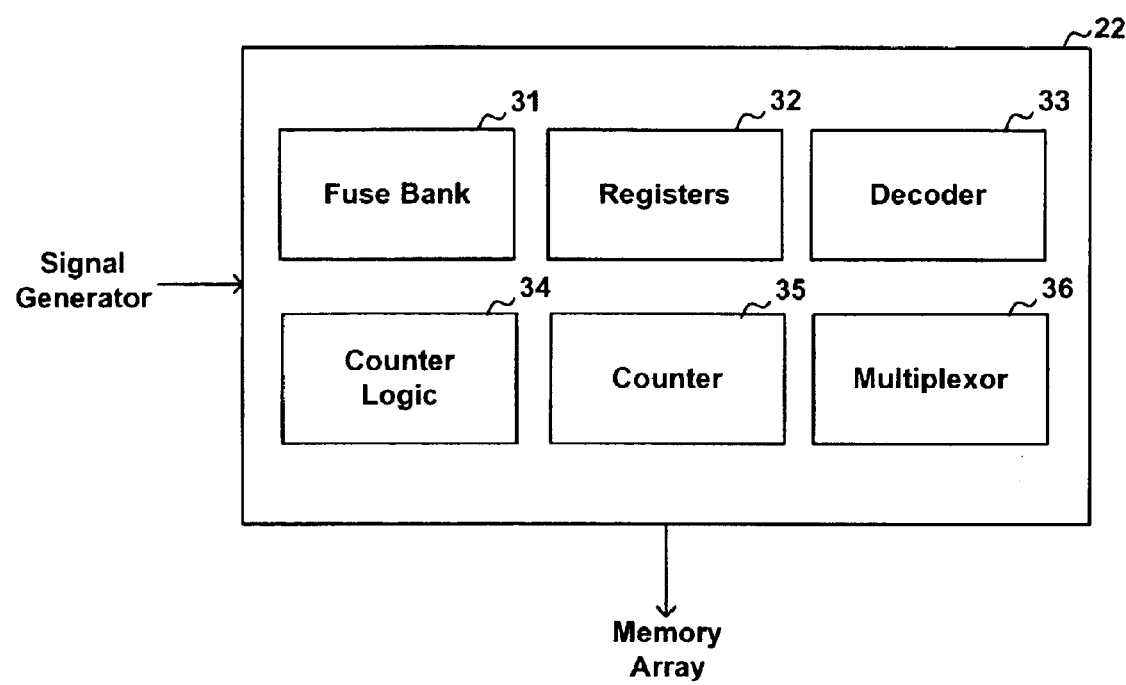
FIG. 3 is a schematic diagram illustrating components utilized for a refresh controller utilizing fuse-selectable logic according to an embodiment of the present invention.

FIG. 3 is a schematic representation of a refresh controller in a DRAM in accordance with an embodiment of the present invention. As is known, a DRAM includes several peripheral circuits for performing reading and writing information to and from memory cells, and for refreshing the memory cells in a self-refresh mode without requiring external row address signals. As compared with FIG. 2, refresh controller 22 additionally includes fuse bank 31, registers 32, decoder 33, counter logic 34, counter 35, and multiplexor 36.

In one exemplary implementation of this embodiment, each fuse in fuse bank 31 corresponds to a respective designated segment in the memory array. If it is detected that the segment includes one or more memory cells that with decay times that are comparatively faster than the average memory cell, and thus requiring a faster refresh rate, the corresponding fuse in fuse bank 31 is blown. This blown fuse will signal that the corresponding segment is to be refreshed at each passing of the counter 35. In contrast, the un-blown fuses indicate that those corresponding segments need not be refreshed as frequently, but instead can be refreshed at alternate passages of the counter 35. Thus, in this exemplary implementation, memory cells in certain segments will be refreshed half as frequently as those in other segments. Whether a fuse is blown indicates which of two possible refresh categories corresponds to a segment.

In some circumstances, it may be useful to provide a greater variety of refresh times. For example, while the average memory cell in an array might only require a refresh every 128 ms, it is possible that a few cells in one segment require a refresh every 64 ms, while a few cells in another segment require refreshes every 32 ms. In this instance (assuming that the cells that require refreshes at 32 ms are not to be designated as defective), it is possible to convey information concerning which refresh rate corresponds with which segment by use of two fuses per segment. Using a standard binary format, two fuses provide $2^2=4$ possible permutations ("00", "01", "10", "11"). Other exemplary implementations can be similarly provided by adding more fuses for each segment.

Figure 4:
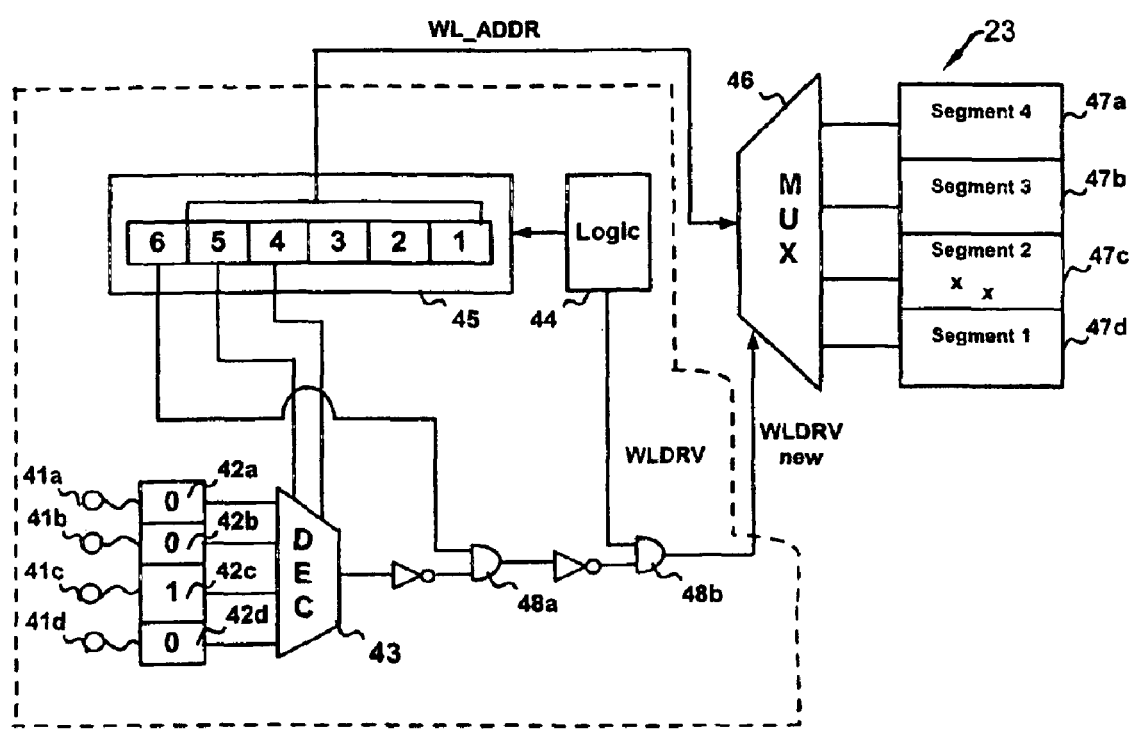
FIG. 4 is a schematic diagram illustrating use of fuse-selectable logic and components of FIG. 3 for refreshing different segments of a DRAM at different refresh rates, according an embodiment of the present invention.

FIG. 4 illustrates the use of fuse-selectable logic and components of FIG. 3 for refreshing different segments of a DRAM at different refresh rates, according an embodiment of the present invention. For the purposes of this illustration, the memory array 23 is divided into four segments, 47a–47d, each containing eight word lines. Each segment of the memory array corresponds with one respective fuse 41a–41d. The fuses enable the refresh logic to be configured for one of two possible refresh rates for each segment.

In the example of FIG. 4, upon fabrication of the memory array, it is detected that two cells (indicated by "x's") within segment 2 require a refresh twice as frequently as those in other segments. Fuses can be formed in either a blow-to-make or blow-to-open configuration. The fuses can be made of polysilicon material which is blown by laser to open a circuit. Thus, fuse 41c is blown, corresponding to segment 2.

At power on of the DRAM chip, the fuses 41a–41d set registers 42a–42d, such that each of 42a, 42b, and 42d are set to "0," or logic low, while 42c is set to "1," or logic high, because attached fuse 41c is blown. During operation, this indicates that segment 2 is to be treated differently from segments 1, 3 and 4.

During self-refresh cycles, six bit counter 45 incrementally counts from 000000 to 111111 (one increment per refresh signal). Of the six bits, the lowest three bits ("321") correspond to the word line within each segment (000–111 corresponds to 8 word lines in a segment). The next two bits (54) corresponds to one of the four segments (00–11). Thus, as examples, counter level 000111 corresponds to Segment 1/Word Line 8, and counter level 001001 corresponds to Segment 2/Word Line 2. As indicated in the figure, these 5 bit lines correspond to a complete word line address in memory. Finally, as explained in further detail below, bit 6 corresponds to whether the counter 45 is performing an "odd" or "even" cycle.

For each counter cycle from 000000 to 000111, word lines 1–8 of segment 1 are incrementally refreshed. At each incremental address, bits 4 and 5 of the counter are at 00, which is input to decoder 43 to read out the contents of 42d that correspond to segment 1, which is 0. The complement of this is a 1, which is input with an AND gate 48a along with the $6^{th}$ bit of counter 45, which is 0, such that 1×0=0. The complement of this result is 1, which is input to a second AND gate 48b along with a 1 from logic 44 (1×1=1) to input a 1 to mux 46. This signals that a refresh is to be performed at each word line address 000 to 111.

For each counter cycle from 001000 to 001111, word lines 1–8 of segment 2 are incrementally refreshed. Since the $6^{th}$ bit of counter 45 remains 0, the result of first AND gate 48a remains 0, and thus the result of second AND gate 48b remains 1. Once again this signals that a refresh is to be performed at each word line address 000 to 111 in segment 2.

As thus can be seen, a word line (between 1 to 8) of a segment (between 1 to 4) is refreshed when the $6^{th}$ bit of the counter 45 is at 0. However, once the $6^{th}$ bit of the counter is incremented to 1, the result of the first AND gate 48a now depends upon the output from decoder 43. When the decoder outputs a 0 (from fuses corresponding to segments 1, 3, or 4), the results of the first AND gate 48a is now 1, the complement of which is 0, such that the second AND gate 48b outputs a 0. Accordingly, when the $6^{th}$ bit of the counter 45 is at 0, none of the word lines for segments 1, 3 and 4 are refreshed. Since fuse 41c is set to 1, the decoder 43 now outputs a 1, such that each of the 8 word lines for segment 2 is refreshed.

In summary then, blowing fuse 41c corresponding to segment 2 results in having each of the word lines in segment 2 refreshed twice as often as those in remaining segments 1, 3 and 4. In this manner, different segments are refreshed at different rates. For example, if the counter cycles from 000000 to 100000 in 64 ms, then segment 2 is refreshed every 64 ms, while word lines in segments 1, 3 and 4 are each refreshed every 128 ms.

Figure 5:
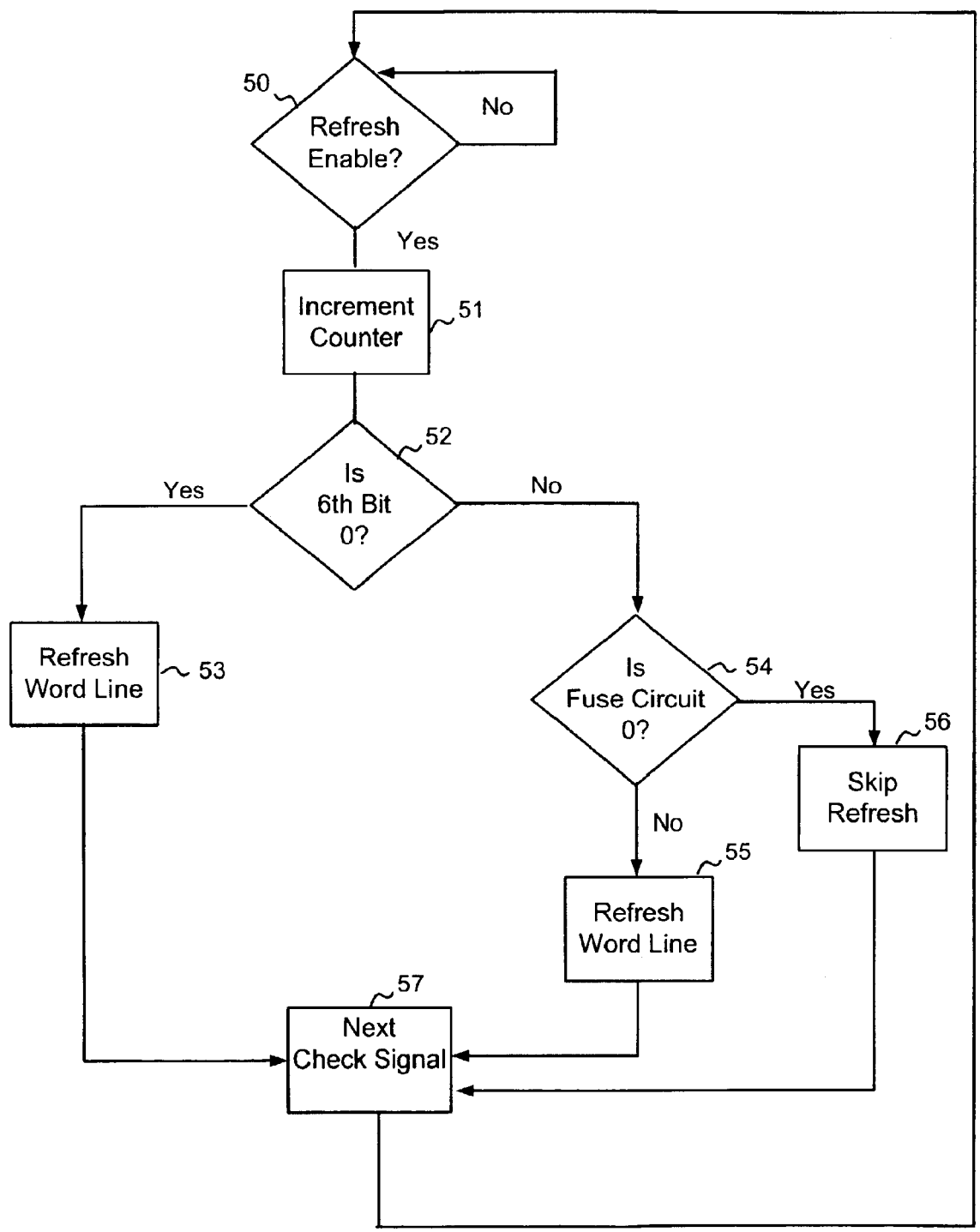
FIG. 5 is a flow diagram illustrating steps of utilizing fuse-selectable logic to refresh word lines in segments of a DRAM at different refresh rates according to an embodiment of the present invention.

FIG. 5 is a flow diagram illustrating the logic performed by the refresh controller in FIG. 4 for an exemplary implementation of an embodiment of the present invention. In step 50, the circuit checks whether it is enabled to perform a refresh. If not, the refresh controller will wait in standby mode until a refresh is re-enabled. As previously discussed, a self-refresh will not be enabled during a reading or writing operation to the memory.

Once a refresh operation begins, the counter is incremented in step 51. In the example of FIG. 4, a 6 bit counter is provided. In practice, the number of bits for the counter will correspond with (i) the number of word address lines per segment, (ii) the number of segments, and (iii) the number of fuses per segment. In this example, as long as the $6^{th}$ bit of the counter is a 0, as determined in step 52, then the corresponding word line is refreshed in step 53. As described above, this occurs regardless of which segment is being refreshed. However, if the $6^{th}$ bit of the counter is a 1, then it must next be determined in step 54 whether the fuse circuit is a 0 or 1. If the fuse circuit is a 0, then the refresh operation is skipped in step 56, such that the refresh operation is performed half as often for that particular segment. On the other hand, if the fuse circuit is a 1, then it is indicated to refresh the word line 55 at each passage of the counter. Upon the next clock signal, in step 57, this process is repeated.

Programmable Logic Embodiment

An advantage associated with the fuse-selectable embodiment is that the DRAM chip can be easily altered by laser-blowing fuses according to the outcome of chip testing for irregularities in charge decay times. As alternative, other types of programmable logic can be employed. Depending upon the particular implementation, other types of programmable logic may provide additional flexibility for determining whether memory cells in a segment are to be refreshed on each passage, alternate passages, every third passage, etc.

Figure 6:
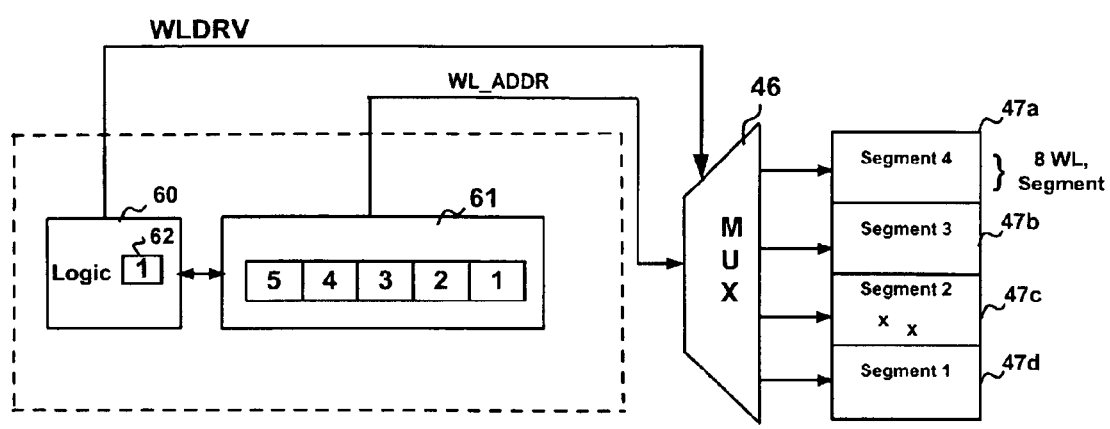
FIG. 6 is a schematic diagram illustrating use of programmable logic for refreshing different segments of a DRAM at different refresh rates, according to another embodiment of the present invention.

FIG. 6 illustrates the use of programmable logic for controlling the refresh of memory cells in a plurality of segments, according to a generic embodiment of the present invention. In this example, as in FIG. 4, the memory array is once again divided into four equal segments, each containing 8 word lines. Instead of using a 6 bit counter, a 5 bit counter (54321) is used, in which the two most significant bits determine which segment is being refreshed (00, 01, 10, 11), and the last three bits determine which word line within a segment are being refreshed (000, 001, 010, 011, 100, 101, 110, 111). The output from counter 61 is input to multiplexor 46 as $WL_{13}$ ADDR to indicate which word line in which segment to refresh. For each increment of the counter, a refresh occurs when a 1 is also received at multiplexor 46 from Logic 60, as WLDRV.

As in FIG. 4, segment 2 contains two memory cells that need to be refreshed twice as often as the memory cells in segments 1, 3, and 4. Therefore, Logic 60 is programmed to set WLDRV to 1 whenever the two most significant bits of counter 61 are 01, but will alternate setting WLDRV to 0 or 1 when the two most significant bits of counter 6 are 00, 10, or 11 (for segments 1, 3, and 4), according to a toggle 62 within Logic 60. The toggle 62 performs in the same manner as the $6^{th}$ bit of counter 45 in FIG. 4.

Figure 7:
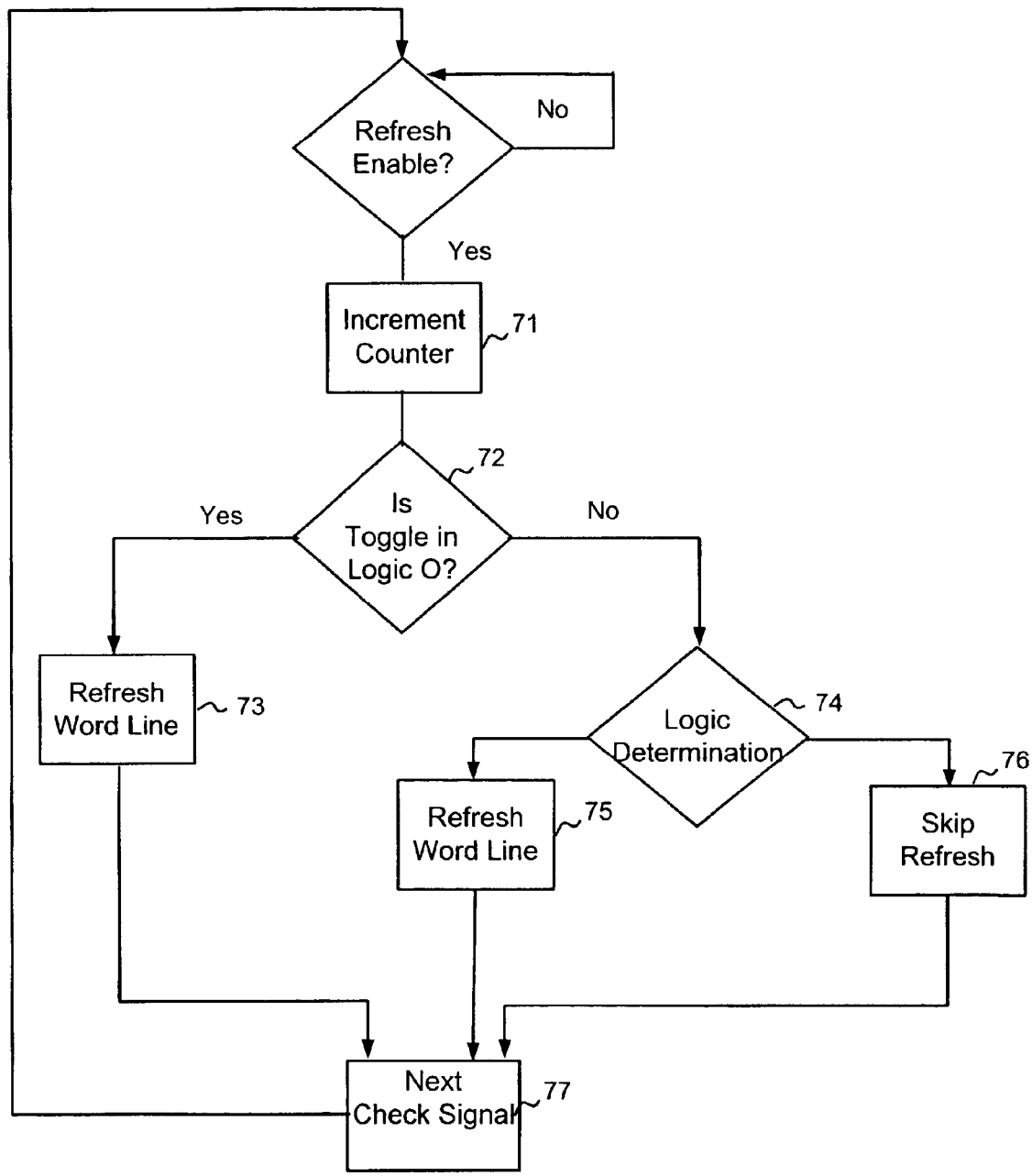
FIG. 7 is a flow diagram illustrating steps of utilizing programmable logic to refresh word lines in segments of a DRAM at different refresh rates according to an embodiment of the present invention.

FIG. 7 is a flow diagram illustrating steps for refreshing segments of a chip using generically-described programmable logic, in accordance with the schematic diagram of FIG. 6. Upon determining that the controller is enabled to perform a refresh operation, in step 70, the counter is incremented in step 71. If the "toggle" in Logic 60, which alternates between 0 and 1, is determined in step 72 to be at 0, then the word line indicated by the counter is refreshed in step 73, regardless of what segment is indicated. If not, then Logic 60 determines in step 74 whether or not to perform a refresh, in steps 75 and 76. Upon completion of steps 73, 75 or 76, the next clock signal in step 77 restarts the process.

Similar to that as described above with regard to the fuse-selectable embodiment, toggle 62 in Logic 60 alternatively may be a plurality of bits, and Logic 60 may be programmed to refresh different segments by refreshing only every third passage of the counter, every fourth passage, etc.

Alternative Segmenting Arrangements

As can now be seen more clearly, there is a tradeoff between the benefits and added complexity associated with the number of segments into which the memory is divided. In the examples provided with reference to FIGS. 4 and 6, all of segment 2 was refreshed twice as often as the memory cells in segments 1, 3, and 4, even though only two individual memory cells required the faster refresh rate. While this arrangement results in a significant improvement over conventional systems, where all four segments were refreshed at the faster refresh rate, a problem still remains in that many memory cells in segment 2 are refreshed more often than necessary.

Figure 8:
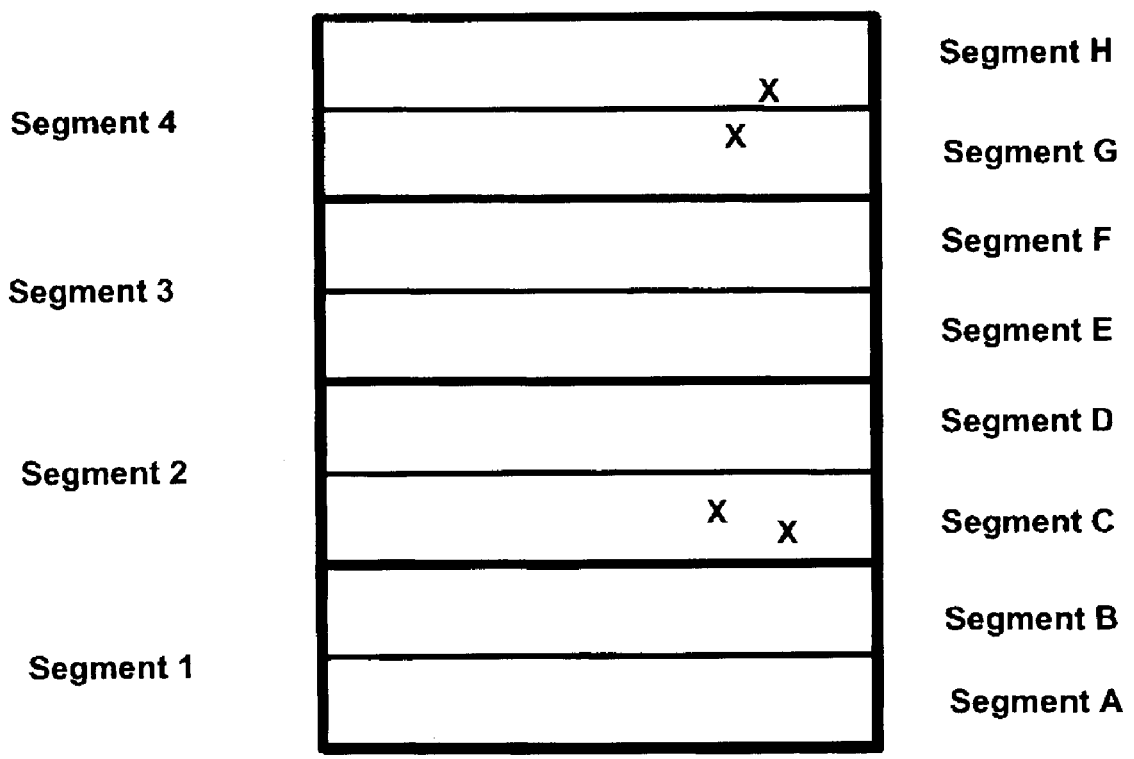
FIG. 8 is a schematic diagram illustrating an alternative method of segmenting the memory array depicted in FIGS. 4 and 6.

One method for reducing the number of cells that are refreshed more often than necessary is to divide the memory array into a different number of segments. FIG. 8 illustrates a memory array that is divided into eight (8) segments, instead of four (4) segments as in FIGS. 4 and 6. As can be seen, such segmentation will result in a significant improvement with regard to "former" segment 2, which is now divided into segments C and D. When divided into four segments, all of segment D previously would have been refreshed at a higher refresh rate along with the rest of Segment 2. However, such segmentation will not result in any improvement with regard to "former" segment 4, since segments G and H will still both require higher refresh rates. Thus, the benefits to be gained by greater segmentation depend in part upon the random nature of the decay rate variations among memory cells. However, with greater segmentation, additional logic is required (and additional fuses), which can add complexity and chip area.

As can be seen in each of the examples of FIGS. 4, 6, and 8, it is common that deviations in storage decay rate will be concentrated in particular areas or regions on the DRAM chip. A manufacturing variation or imperfection in silicon (or other materials) is likely to occur across an area of the chip that affects several nearby memory cells. This is one reason why dividing the memory into segments can be helpful (if the variations in the memory cells is completely random across the chip, then all of the segments will still be refreshed at the same rate).

As an alternative to dividing the memory array into equal segments, it also may be possible to more closely identify a range of memory cells whose refresh rates are distinguished from the rest of the chip. The memory array will then be divided into two segments: (i) those word lines that are within the identified range, and (ii) all of the remaining word lines that fall outside the range. For example, assume that a few memory cells between word lines 0100110 and 0101101 require refreshing twice as often as other memory cells in the memory array. It is possible to perform a self-refresh at a first refresh rate for the word lines that are within the identified range, and perform a self-refresh at a second refresh rate for the rest of the memory array. The two refresh rates can be multiples of each other (e.g., where the second refresh rate is half of the first refresh rate), using logic similar to that shown with reference to FIGS. 4 and 6.

One method for the refresh controller to segment the "identified range" is to use two sets of fuses, where individual fuses in one fuse set can be used to identify a word line at the start of the identified range (by laser-blowing fuses to indicate a 0 or 1), and fuses in a second fuse set can be used to identify a word line at the end of the identified range. When it is determined that the counter is outside the range of these two word lines, a toggle switch can be utilized to refresh memory cells at every other passage of the counter.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for reducing refresh frequency for a plurality of memory cells in a DRAM, comprising: portioning a memory array comprised of a plurality of memory cells into a plurality of segments; identifying memory cells in the memory array requiring a refresh rate that is faster than the refresh rate required for the remaining memory cells in the memory array; identifying a segment corresponding to the identified memory cells; and when a refresh operation is enabled, refreshing memory cells in an identified segment at a different refresh rate than the refresh rate that is applied to memory cells in other segments of the memory array.

2. The method of claim 1, wherein the refresh rate applied for refreshing memory cells in an identified segment is faster than the refresh rate applied for refreshing memory cells in all other segments.

3. The method of claim 2, wherein memory cells in an identified segment are refreshed at a first refresh rate, other memory cells in other segments in the memory array are refreshed at a second refresh rate, and the first and second refresh rates are multiples of each other.

4. The method of claim 3, wherein the first refresh rate is twice a frequency of the second refresh rate.

5. The method of claim 4, wherein a counter, having bits for addressing word lines in the memory array, is incremented consecutively during a refresh operation to individually refresh word lines, and wherein memory cells in word lines to be refreshed at the first refresh rate are refreshed at each passage of the counter, and memory cells in word lines to be refreshed at the second refresh rate at refreshed periodically at alternating passages of the counter.

6. The method of claim 5, wherein memory cells in word lines to be refreshed at the second refresh rate are refreshed at every third passage of the counter.

7. The method of claim 1, wherein an identification of segments corresponding to the identified memory cells is stored using fuses.

8. The method of claim 7, wherein the multi-bit counter increments a toggle to identify a cycle of the counter, the method further comprising: refreshing memory cells in the word line regardless of the refresh rate corresponding with the associated segment when the toggle indicates a first counter cycle; and refreshing the word line depending upon the counter cycle and the refresh rate corresponding with the associated segment when the toggle indicates another counter cycle.

9. The method of claim 8, wherein the toggle alternates between identifying first and second cycles of the counter.

10. A method for self-refreshing different segments of a DRAM at different refresh rates, wherein each segment is comprised of a plurality of word lines of memory cells, comprising: incrementing a multi-bit counter, wherein a plurality of bits correspond a word line address in the DRAM; determining the rate at which the segment that is associated with the word line address indicated by the counter is to be refreshed, wherein (i) segments having a high refresh rate are refreshed at each cycle of the counter, and (ii) segments with a low refresh rate are refreshed at intermittent cycles of the counter; and performing a refresh of memory cells in the word line depending upon the counter cycle and the refresh rate corresponding with the associated segment.

11. The method of claim 10, wherein the step of determining the rate at which the segment that is associated with the word line address indicated by the counter is to be refreshed is performed using programmable logic on the DRAM.

12. The method of claim 10, wherein the rate at which the segment that is associated with the word line address indicated by the counter is to be refreshed is determined during initial testing by identifying whether any memory cells in the segment require a refresh rate that is substantially faster than the refresh rate required for the remaining memory cells in the memory array.

13. The method of claim 12, wherein each segment is associated with a respective a fuse located on the DRAM, and the status of each fuse indicates the refresh rate of the corresponding segment.

14. A refresh controller assembly for generating self-refreshes in a DRAM portioned into a number of segments, comprising:

a multi-bit counter comprising a plurality of bits corresponding to word line addresses in each segment of the DRAM, for incrementally generating word line addresses; and logic for determining whether the word line at the address indicated by the counter is to be refreshed during a cycle of the counter, the logic comprising a fuse corresponding to each respective segment of the DRAM, wherein different segments of the DRAM are refreshed at different refresh rates, a status of each fuse indicates the refresh rate of the corresponding segment, the fuse status indicating whether the corresponding segment operates at a first or second refresh rate.

15. The refresh controller according to claim 14, wherein the first and second refresh rate are multiples of each other.

16. The refresh controller according to claim 14, further comprising a register set comprising a set of registers, each connected to a respective fuse, for storing the refresh rate associated with each respective segment of the DRAM.

17. The refresh controller according to claim 16, wherein the toggle alternates between identifying first and second cycles of the counter.

18. The refresh controller according to claim 14, wherein the multi-bit counter increments a toggle to identify a cycle of the counter, and for each word line address indicated by the counter, the logic determines whether to refresh the corresponding word line depending upon the cycle identified in the toggle and the refresh rate indicated by the status of the fuse associated with the corresponding segment.

* * * * *